United States Patent
Chan et al.

(10) Patent No.: US 9,349,705 B2
(45) Date of Patent: May 24, 2016

(54) METHOD OF FABRICATING A SEMICONDUCTOR STRUCTURE HAVING CONDUCTIVE BUMPS WITH A PLURALITY OF METAL LAYERS

(71) Applicant: Siliconware Precision Industries Co., Ltd., Taichung (TW)

(72) Inventors: Chien-Feng Chan, Taichung (TW); Mu-Hsuan Chan, Taichung (TW); Chun-Tang Lin, Taichung (TW); Yi-Che Lai, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/616,078

(22) Filed: Feb. 6, 2015

(65) Prior Publication Data
US 2015/0155258 A1    Jun. 4, 2015

Related U.S. Application Data

(62) Division of application No. 13/677,904, filed on Nov. 15, 2012, now Pat. No. 8,952,537.

(30) Foreign Application Priority Data
Jul. 9, 2012    (TW) .............................. 101124582 A

(51) Int. Cl.
*H01L 21/4763* (2006.01)
*H01L 23/00* (2006.01)
(Continued)

(52) U.S. Cl.
CPC .............. *H01L 24/81* (2013.01); *H01L 21/441* (2013.01); *H01L 21/56* (2013.01); *H01L 23/488* (2013.01); *H01L 24/13* (2013.01); *H01L 24/16* (2013.01); *H01L 23/145* (2013.01); *H01L 23/147* (2013.01); *H01L 24/32* (2013.01); *H01L 24/83* (2013.01); *H01L 24/92* (2013.01); *H01L 2224/13084* (2013.01); *H01L 2224/13109* (2013.01); *H01L 2224/13111* (2013.01); *H01L 2224/13113* (2013.01); *H01L 2224/13147* (2013.01); *H01L 2224/13155* (2013.01);
(Continued)

(58) Field of Classification Search
CPC ..... H01L 23/488; H01L 24/441; H01L 24/56; H01L 24/13; H01L 24/16; H01L 24/81
See application file for complete search history.

(56) References Cited

U.S. PATENT DOCUMENTS 6,596,621 B1    7/2003    Copeland et al.
7,202,569 B2    4/2007    Tomono
(Continued)

*Primary Examiner* — Minh-Loan Tran
*Assistant Examiner* — Farid Khan
(74) *Attorney, Agent, or Firm* — Mintz Levin Cohn Ferris Glovsky and Popeo, P.C.; Peter F. Corless; Steven M. Jensen

(57) ABSTRACT

A conductive bump structure used to be formed on a substrate having a plurality of bonding pads. The conductive bump structure includes a first metal layer formed on the bonding pads, a second metal layer formed on the first metal layer, and a third metal layer formed on the second metal layer. The second metal layer has a second melting point higher than a third melting point of the third metal layer. Therefore, a thermal compression bonding process is allowed to be performed to the third metal layer first so as to bond the substrate to another substrate, and then a reflow process can be performed to melt the second metal layer and the third metal layer into each other so as to form an alloy portion, thus avoiding cracking of the substrate.

15 Claims, 5 Drawing Sheets

(51) Int. Cl.
   *H01L 23/488* (2006.01)
   *H01L 21/441* (2006.01)
   *H01L 21/56* (2006.01)
   *H01L 23/14* (2006.01)

(52) U.S. Cl.
   CPC ............... *H01L 2224/13166* (2013.01); *H01L 2224/16225* (2013.01); *H01L 2224/16237* (2013.01); *H01L 2224/32225* (2013.01); *H01L 2224/73104* (2013.01); *H01L 2224/73204* (2013.01); *H01L 2224/81193* (2013.01); *H01L 2224/81203* (2013.01); *H01L 2224/81805* (2013.01); *H01L 2224/81815* (2013.01); *H01L 2224/81986* (2013.01); *H01L 2224/83104* (2013.01); *H01L 2224/83191* (2013.01); *H01L 2224/83192* (2013.01); *H01L 2224/9211* (2013.01); *H01L 2224/92125* (2013.01); *H01L 2924/3512* (2013.01)

(56) References Cited

U.S. PATENT DOCUMENTS

| | | | |
|---|---|---|---|
| 7,314,819 B2 | 1/2008 | Hua et al. | |
| 7,839,000 B2 | 11/2010 | Mis et al. | |
| 8,003,512 B2 | 8/2011 | Belanger et al. | |
| 8,232,193 B2 | 7/2012 | Chang | |
| 8,242,011 B2 * | 8/2012 | Lim | H01L 24/11 257/E21.476 |
| 8,269,345 B2 * | 9/2012 | Patel | H01L 24/11 257/737 |
| 8,349,721 B2 | 1/2013 | Shim et al. | |
| 8,409,919 B2 | 4/2013 | Aoki et al. | |
| 8,574,964 B2 | 11/2013 | Cho et al. | |
| 8,581,420 B2 | 11/2013 | Tsai et al. | |
| 2002/0151164 A1 | 10/2002 | Jiang et al. | |
| 2003/0155408 A1 | 8/2003 | Fanti et al. | |
| 2005/0275098 A1 | 12/2005 | Wu | |
| 2008/0277784 A1 | 11/2008 | Ozaki et al. | |
| 2010/0109159 A1 | 5/2010 | Ho et al. | |
| 2010/0221873 A1 | 9/2010 | Marimuthu et al. | |
| 2010/0308443 A1 | 12/2010 | Suthiwongsunthorn et al. | |
| 2011/0074020 A1 * | 3/2011 | Yamakami | H01L 24/11 257/737 |
| 2011/0186989 A1 | 8/2011 | Hsiao et al. | |
| 2011/0193219 A1 | 8/2011 | Lai et al. | |
| 2011/0260316 A1 * | 10/2011 | Jang | H01L 24/81 257/737 |
| 2011/0304029 A1 | 12/2011 | Sogawa et al. | |
| 2012/0007231 A1 * | 1/2012 | Chang | H01L 24/11 257/737 |
| 2012/0037940 A1 | 2/2012 | Ishimori | |
| 2012/0040524 A1 * | 2/2012 | Kuo | H01L 24/11 438/614 |
| 2012/0091576 A1 | 4/2012 | Tsai et al. | |
| 2012/0091577 A1 * | 4/2012 | Hwang | H01L 24/11 257/737 |
| 2012/0146181 A1 | 6/2012 | Lin et al. | |
| 2012/0175683 A1 | 7/2012 | Venkatraman et al. | |
| 2012/0252378 A1 | 10/2012 | Teshima | |
| 2012/0270699 A1 | 10/2012 | Stoller et al. | |
| 2012/0273945 A1 | 11/2012 | Chang | |
| 2012/0280388 A1 | 11/2012 | Wu et al. | |
| 2013/0026622 A1 * | 1/2013 | Chuang | H01L 24/11 257/737 |
| 2013/0087908 A1 | 4/2013 | Yu et al. | |
| 2013/0093076 A1 | 4/2013 | Lin et al. | |
| 2013/0241071 A1 | 9/2013 | Hsieh | |
| 2013/0264705 A1 | 10/2013 | Jang et al. | |
| 2013/0295762 A1 | 11/2013 | Lu et al. | |
| 2013/0299965 A1 * | 11/2013 | Gandhi | H01L 23/3142 257/737 |
| 2014/0070409 A1 | 3/2014 | Lai et al. | |

* cited by examiner

METHOD OF FABRICATING A SEMICONDUCTOR STRUCTURE HAVING CONDUCTIVE BUMPS WITH A PLURALITY OF METAL LAYERS

CROSS-REFERENCE TO RELATED APPLICATIONS

This application is a divisional of copending application U.S. Ser. No. 13/677,904, filed on Nov. 15, 2012, which claims under 35 U.S.C. §119(a) the benefit of Taiwanese Application No. 101124582, filed Jul. 9, 2012, the entire contents of which are incorporated herein by reference.

BACKGROUND OF THE INVENTION

1. Field of the Invention

The present invention relates to semiconductor structures, and, more particularly, to a conductive bump structure and a method of fabricating a stack-typed semiconductor structure.

2. Description of Related Art

Referring to FIG. 1A, in a conventional flip-chip packaging process, a semiconductor chip 1 having a plurality of bonding pads 110 and a packaging substrate 12 having a plurality of conductive pads 120 are provided. A solder material (not shown) is formed on each of the bonding pads 110 and a pre-solder material (not shown) is formed on each of the conductive pads 120. The solder material is aligned with the pre-solder material and reflowed to form solder bumps 10. Thereafter, an underfill 13 is formed between the semiconductor chip 11 and the packaging substrate 12 to encapsulate the solder bumps 10, thereby forming a flip-chip semiconductor package 1. The use of the solder bumps 10 leads to short electrical conductive paths, improves electrical performance, facilitates heat dissipation and results in a small package size, and is becoming more and more popular.

However, when the solder material is reflowed, it is difficult to control the average value and deviation of the volume and height of the solder bumps 10. Further, the collapse range of the solder bumps 10 needs to be accurately controlled. If the collapse range of the solder bumps 10 is wide, a solder bridge can easily occur between two adjacent solder bumps 10 so as to result in a short circuit. In addition, if the average value and deviation of the volume and height of the solder bumps 10 are large, the solder bumps 10 arranged in a grid array can have poor coplanarity, thus resulting in product failure and low reliability. As such, the semiconductor chip 11 cannot meet the fine-pitch requirement.

Accordingly, a flip-chip bump technology is provided. Referring to FIG. 1B, an under bump metallurgy (UBM) layer 101 and a copper post 100 are sequentially formed on each of the bonding pads 110 of a semiconductor chip 11', and a solder material 102 is further formed on the copper post 100. Since the shape of the copper post dose not change in a reflow process, the height and volume of the bumps can be easily controlled so as for the semiconductor chip 1 to meet the fine-pitch requirement.

Further, along with miniaturization of electronic products, I/O pitches are continuously decreased and more and more chips and functions are integrated in a given area. Consequently, 3D stack technologies are developed.

Generally, in flip-chip process, the bumps which have the copper posts 100, a thermal compression bonding (TCB) process is performed such that the solder material 102 on the copper posts 100 and pre-solder material (not shown) are reflowed to form bumps 10'. Therefore, an ultra high compression force and an ultra high temperature are required in the TCB process.

Further, smaller size of electronic elements (such as the semiconductor chip 11') are more significantly affected by RC delays. When RC delays increase, cross talks and capacitive couplings occurring between circuits will seriously adversely affect the speed and quality of signal transmissions. Therefore, low-k materials are used to avoid RC delays.

However, since a low-k material is hard and crisp, when used as the semiconductor chip 11', the low-k material is easy to crack during the conventional TCB process due to the ultra high compression force and high temperature.

Therefore, how to overcome the above-described drawbacks has become critical.

SUMMARY OF THE INVENTION

Accordingly, the present invention provides a conductive bump structure that can be formed on a substrate having a plurality of bonding pads. The conductive bump structure comprises a first metal layer formed on the bonding pads, a second metal layer formed on the first metal layer, and a third metal layer formed on the second metal layer, wherein the second metal layer has a second melting point higher than a third melting point of the third metal layer.

In an embodiment, the first metal layer has a first melting point higher than the second melting point and the third melting point.

The present invention further provides a method of fabricating a semiconductor structure, comprising: providing a carrier and a substrate having a plurality of bonding pads and a plurality of conductive bumps formed respectively on the bonding pads, wherein each of the conductive bumps has a first metal layer formed on a corresponding one of the bonding pads, a second metal layer formed on the first metal layer, and a third metal layer formed on the second metal layer, and the second metal layer has a second melting point higher than a third melting point of the third metal layer; heating the substrate and the carrier to a first temperature range, allowing the third metal layer to be melted and thereby bonded with the carrier; and heating the substrate and the carrier to a second temperature range, allowing the second metal layer to be melted to form an alloy portion with the third metal layer, and the first metal layer and the alloy portion to form a conductor for electrically connecting the carrier and the substrate.

In an embodiment, the substrate is made of a low-k material.

In an embodiment, the carrier is made of a low-k material.

In an embodiment, the carrier is a semiconductor substrate or an organic substrate.

In an embodiment, the method further comprises forming a solder material on the carrier for bonding with the third metal layer, and the solder material and the third metal layer are made of same material.

In an embodiment, the alloy portion has a melting point ranging between 197 and 213.

In an embodiment, the method further comprises forming at least a conductive post between the carrier and the solder material, such that after the second metal layer is melted, the at least a conductive post being bonded to the alloy portion.

In an embodiment, the method further comprises forming an encapsulant between the carrier and the substrate for encapsulating the conductors. The encapsulant can be formed after the second metal layer is melted. Alternatively, the encapsulant can be formed on the carrier before the substrate is bonded to the carrier, and, after the substrate is bonded to the carrier, the conductive bumps are embedded in the encapsulant. In another embodiment, the encapsulant can be formed on the substrate to encapsulate the conductive bumps before the substrate is bonded to the carrier, and then the carrier is laminated to the encapsulant.

In an embodiment, the second metal layer is made of a lead-free solder material, the lead-free solder material comprises Sn—Ag or Sn—Ag—Cu, and the second melting point of the second metal layer is between 200° C. and 250° C.

In an embodiment, the third metal layer is made of a lead-free material, the lead-free material can comprise Bi or In, and the third melting point of the third metal layer can be between 70° C. and 160° C.

In an embodiment, a barrier layer is further formed between the first metal layer and the second metal layer such that the conductor further comprises the barrier layer formed between the first metal layer and the alloy portion.

According to the present invention, the conductive bump structure comprises three metal materials having different melting points. When the conductive bump structure is heated to a first temperature range, only the third metal material and the solder material are melted and bonded with each other. When the conductive bump structure is further heated to a second temperature range, the second metal layer and the third metal layer as well as the solder material are melted into an alloy portion, which thus forms a conductor with the first metal layer. Therefore, the present invention avoids cracking of the substrate made of a low-k material and improves the reliability of the conductors.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that the drawings are only for illustrative purposes and not intended to limit the present invention. Meanwhile, terms such as "on", "first", "second" "a" etc. are only used as a matter of descriptive convenience and not intended to have any other significance or provide limitations for the present invention.

FIGS. 2A to 2D are schematic cross-sectional views showing a method of fabricating a semiconductor structure 2 according to a first embodiment of the present invention.

Figure 1A:
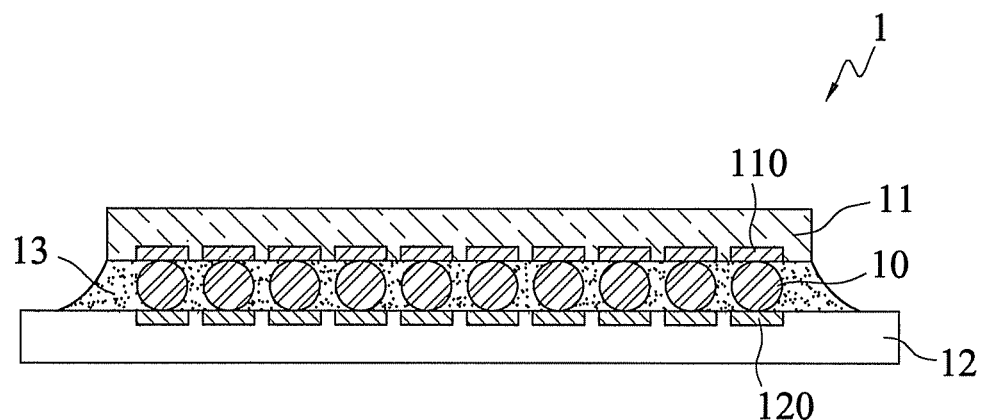
FIG. 1A is a schematic cross-sectional view showing a conventional flip-chip semiconductor package.
Figure 1B:
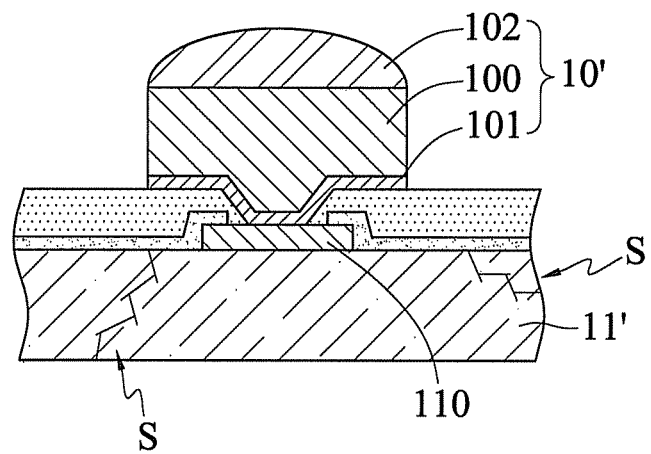
FIG. 1B is a partially cross-sectional view of a conventional flip-chip type semiconductor chip.
Figure 2A:
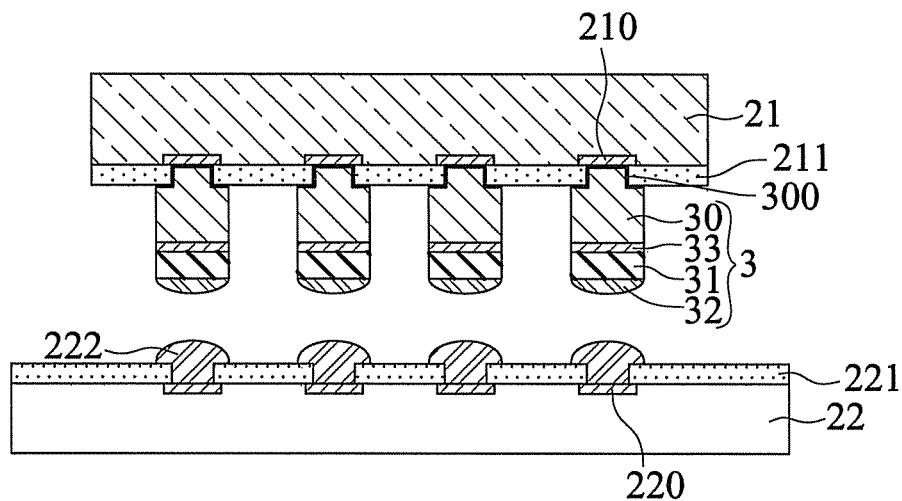
FIGS. 2A to 2D are schematic cross-sectional views showing a method of fabricating a semiconductor structure according to a first embodiment of the present invention, wherein FIG. 2A' shows another embodiment of FIG. 2A.
Figure 2A:
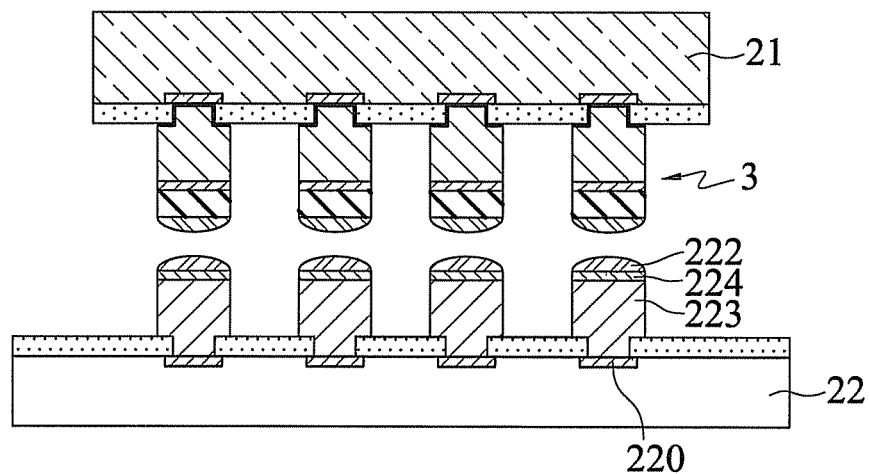

Referring to FIG. 2A, a substrate 21 and a carrier 22 are provided.

The substrate 21 has a plurality of first bonding pads 210 and a first insulating layer 211 formed thereon. The first insulating layer 211 has a plurality of openings for exposing the first bonding pads 210, respectively. Further, a plurality of conductive bumps 3 are formed on the first bonding pads 210, respectively.

The carrier 22 has a plurality of second bonding pads 220 and a second insulating layer 221 formed thereon. The second insulating layer 221 has a plurality of openings for exposing the second bonding pads 220, respectively. A solder material 222 is further formed on each of the second bonding pads 220.

In an embodiment, the semiconductor substrate 21 and the carrier 22 are chips made of low-k materials.

In other embodiments, the carrier 22 is a packaging substrate used for a flip-chip process. In yet another embodiment, the carrier 22 is a semiconductor substrate or an organic substrate.

Each of the conductive bumps 3 has a first metal layer 30, a second metal layer 31 formed on the first metal layer 30, and a third metal layer 32 formed on the second metal layer 31. In an embodiment, an UBM layer 300 is formed on each of the first bonding pads 210, and the conductive bump 3 is further formed on the UBM layer 300. The UBM layer 300, for example but not limited to, is made of Ti/Cu.

The first metal layer 30, for example but not limited to, is made of copper and formed on the first bonding pads 210 by electroplating.

The second metal layer 31 is formed on the first metal layer 30. The second metal layer 31 can be made of a lead-free material, for example, the second metal layer 31 can comprise Sn—Ag or Sn—Ag—Cu.

The third metal layer 32 is formed on the second metal layer 31. The third metal layer 32 can be made of a lead-free material, for example, the third metal layer 32 can comprise Bi, In or Sn. The second metal layer 31 has a second melting point higher than a third melting point of the third metal layer 32. The first metal layer 30 has a first melting point higher than the second melting point of the second metal layer 31 and the third melting point of the third metal layer 32.

In an embodiment, the second melting point of the second metal layer 31 is between 200° C. and 250° C. For example, the melting point of Sn—Ag is 217. The third melting point of the third metal layer 32 is between 70° C. and 160° C. For example, the melting point of Sn—Bi is 138° C.

Further, the third metal layer 32 and the solder material 222 have similar characteristics. For example, both the third metal layer 32 and the solder material 222 have low melting points and can be made of same material. For example, the solder material 222 can be made of Sn—Bi.

A barrier layer 33 is further formed between the first metal layer 30 and the second metal layer 31. In an embodiment, the barrier layer 33 is made of nickel.

In another embodiment, referring to FIG. 2A', a conductive post 223 and a barrier layer 224 are formed between each of the second bonding pads 220 and the corresponding solder material 222. In an embodiment, the conductive post 223 and the first metal layer 30 are made of same material. That is, the conductive post 223 is also made of copper.

Figure 2B:
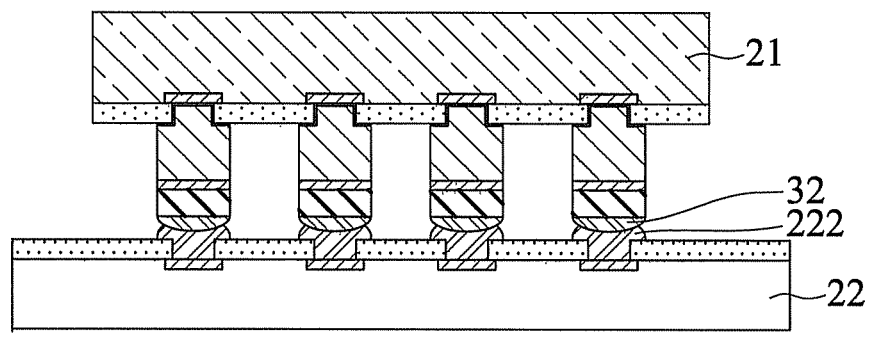

Referring to FIG. 2B, a TCB process is performed to heat the substrate 21 and the carrier 22 to a first temperature range so as to bond the solder material 222 to the third metal layer 32, thereby connecting the semiconductor substrate 21 and the carrier 22 in a stacking manner.

In an embodiment, when the temperature of the TCB process exceeds 138 (the melting point of Sn—Bi), the solder material 222 and the third metal layer 32 (for example, Sn—Bi, Sn—In or Sn—In—Bi) will be bonded together.

Since the TCB process is performed at a low temperature and a low compression force to bond the third metal layer 32 and the solder material 222 made of materials having low melting points, cracking of a low-k material such as the substrate 21 can be avoided.

Figure 2C:
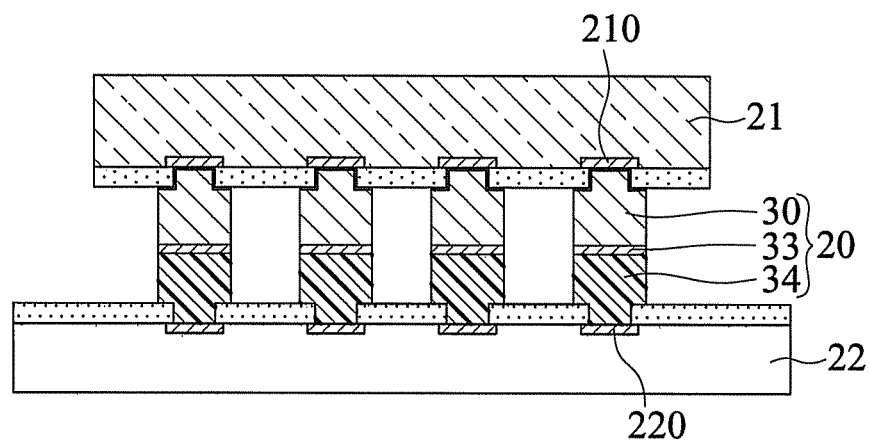

Referring to FIG. 2C, a reflow process is performed to heat the substrate 21 and the carrier 22 to a second temperature range such that the second metal layer 31 is melted to form an alloy portion 34 with the third metal layer 32 and the solder material 222. As such, the first metal layer 30, the bather layer 33 and the alloy portion 34 form a conductor 20 for connecting the substrate 21 and the carrier 22.

In an embodiment, when the temperature of the reflow process exceeds 217° C. (the melting point of Sn—Ag), the second metal layer 31 and the above-described new alloy formed by bonding the solder material 222 and the third metal layer 32 are bonded together to form the alloy portion 34 (for example, Sn—Bi—Ag or Sn—In—Ag—Bi).

The reflow process is performed at a high temperature so as to melt a high melting point material and a low melting point material into an alloy, i.e., an inter-metallic compound (IMC) having a high melting point, thereby increasing the bonding force between the conductor 20 and the chip. For example, the melting point of the alloy portion 34 is between 197° C. and 213° C.

The melting point of the alloy portion 34 can be close to the melting point of the second metal layer 31 (such as the melting point of Sn—Ag) so as to facilitate to pass through a reliability test.

Further, continued from FIG. 2A', after the second metal layer 31 is melted, the conductive post 223 (or the barrier layer 224) is bonded to the alloy portion 34.

Figure 2D:
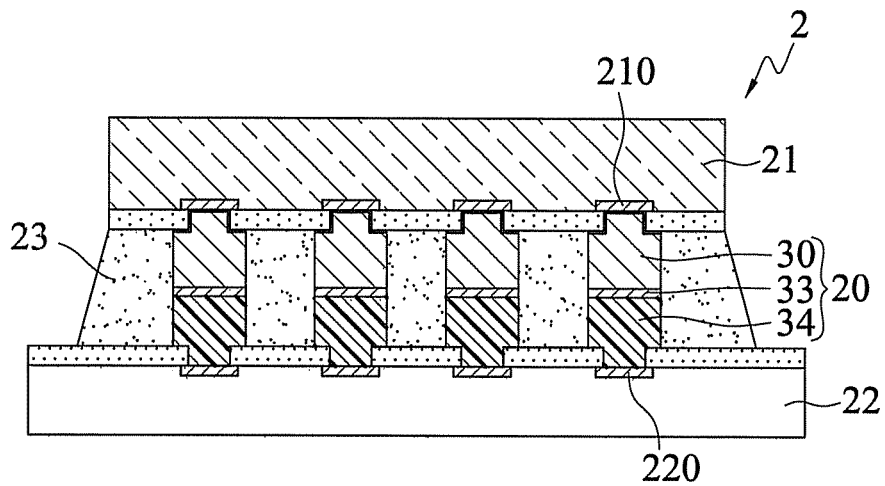

Referring to FIG. 2D, an encapsulant 23 (such as an underfill) is formed between the substrate 21 and the carrier 22 so as to encapsulate the conductors 20.

According to the present invention, since each of the conductive bumps 3 comprises the second metal layer 31 and the third metal layer 32 that have different melting points, a TCB process can be performed at a low compression force and a low temperature to pre-bond materials having low melting points, i.e., the third metal layer 32 and the solder material 222, thus avoiding cracking of the substrate 21 made of a low-k material.

Further, by performing a reflow process at a high temperature, the second metal layer 31 having a high melting point can be melted to form an alloy with materials having low melting points, thus increasing the reliability of the conductors 20.

Figure 3A:
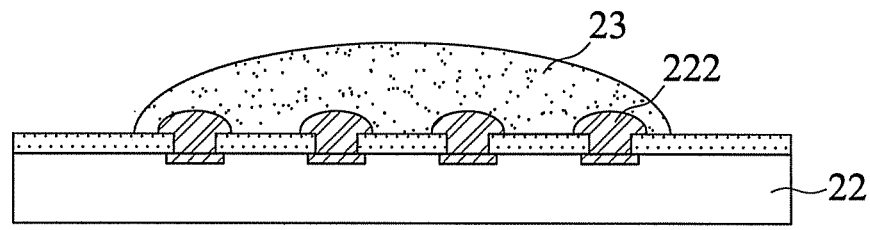
FIGS. 3A to 3C are schematic cross-sectional views showing a method of fabricating a semiconductor structure according to a second embodiment of the present invention.
Figure 3B:
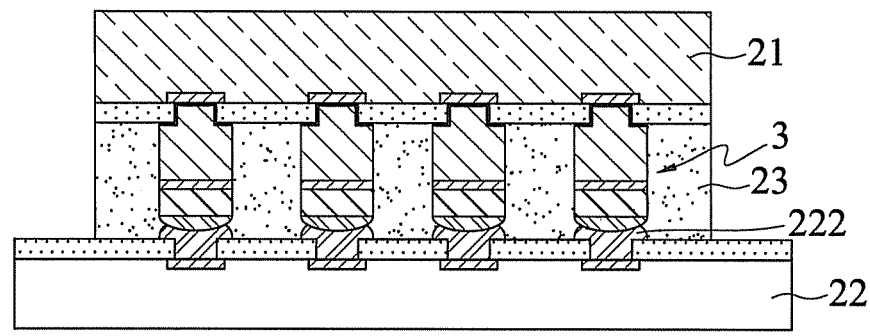
Figure 3C:
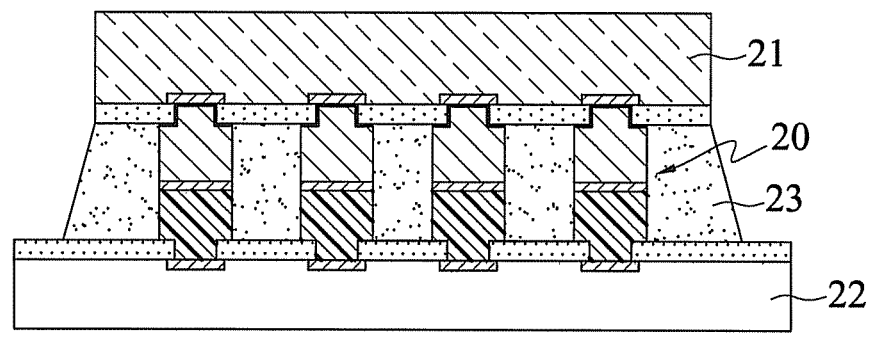

FIGS. 3A to 3C are schematic cross-sectional views showing a method of fabricating a semiconductor structure according to a second embodiment of the present invention. The second embodiment differs from the first embodiment in the formation of the encapsulant 23.

Referring to FIG. 3A, an encapsulant 23 is formed on the carrier 22 to encapsulate the solder material 222.

Referring to FIG. 3B, the semiconductor substrate 21 is laminated on the encapsulant 23 such that the conductive bumps 3 are embedded in the encapsulant 23 and the third metal layer 32 is disposed on the solder material 222. Then, a TCB process is performed to bond the third metal layer 32 and the solder material 222 together.

Referring to FIG. 3C, a reflow process is performed to form conductors 20 for connecting the substrate 21 and the carrier 22.

Figure 4A:
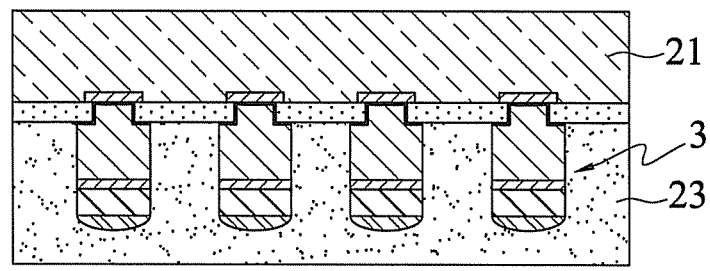
FIGS. 4A to 4C are schematic cross-sectional views showing a method of fabricating a semiconductor structure according to a third embodiment of the present invention.
Figure 4B:
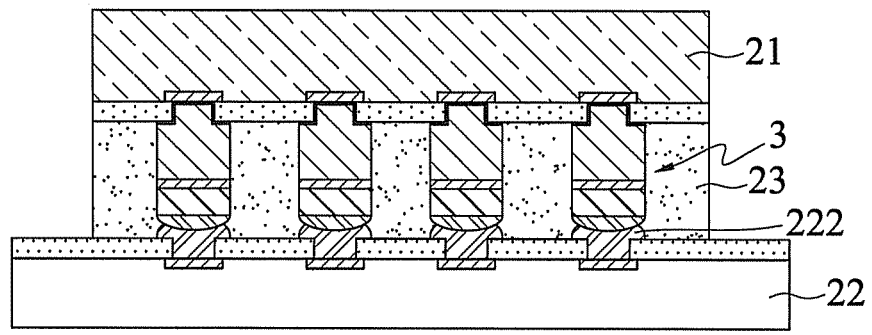
Figure 4C:
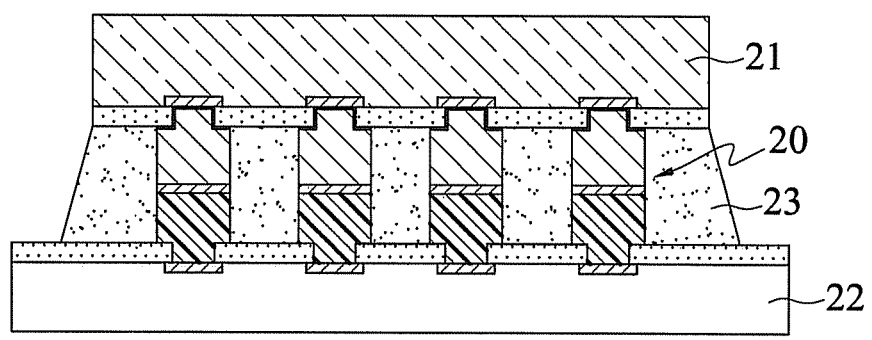

FIGS. 4A to 4C are schematic cross-sectional views showing a method of fabricating a semiconductor structure according to a third embodiment of the present invention. The third embodiment differs from the second embodiment in the formation of the encapsulant 23.

Referring to FIG. 4A, an encapsulant 23 is formed on the substrate 21 to encapsulate the conductive bumps 3.

Referring to FIG. 4B, a carrier 22 is laminated on the encapsulant 23 such that the solder material 222 is embedded in the encapsulant 23 and the third metal layer 32 is disposed on the solder material 222. Then, a TCB process is performed to bond the third metal layer 32 and the solder material 222 together.

Referring to FIG. 4C, a reflow process is performed to form conductors 20 for connecting the substrate 21 and the carrier 22.

Therefore, by providing a second metal layer and a third metal layer on the first metal layer, the present invention allows a low temperature TCB process to be performed to bond the third metal layer with a solder material, and then a high temperature reflow process can be performed such that the second metal layer and the third metal layer as well as the solder material are melted to form an alloy portion having a high melting point, thereby avoiding cracking of the substrate and improving the reliability of conductors.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A method of fabricating a semiconductor structure, comprising:
   providing a carrier and a substrate having a plurality of bonding pads and a plurality of conductive bumps formed respectively on the bonding pads, wherein each of the conductive bumps has a first metal layer formed on a corresponding one of the bonding pads, a second metal layer formed on the first metal layer, and a third metal layer formed on the second metal layer, and the second metal layer has a second melting point higher than a third melting point of the third metal layer;
   heating the substrate and the carrier to a first temperature range, so as for the third metal layer to be melted and thereby bonded with the carrier; and
   heating the substrate and the carrier to a second temperature range, so as for the second metal layer to be melted to form an alloy portion with the third metal layer, and the first metal layer and the alloy portion to form a conductor for electrically connecting the carrier and the substrate.

2. The method of claim 1, wherein the substrate is made of a low-k material.

3. The method of claim 1, wherein the second melting point of the second metal layer is between 200° C. and 250° C.

4. The method of claim 1, wherein the third melting point of the third metal layer is between 70° C. and 160° C.

5. The method of claim 1, wherein the alloy portion has a melting point ranging between 197 and 213° C.

6. The method of claim 1, wherein the substrate or the carrier is made of a low-k material.

7. The method of claim 1, wherein the carrier is a semiconductor substrate or an organic substrate.

8. The method of claim 1, further comprising a solder material formed on the carrier for bonding with the third metal layer.

9. The method of claim 8, wherein the solder material and the third metal layer are made of a same material.

10. The method of claim 8, further comprising forming at least a conductive post between the carrier and the solder material, such that after the second metal layer is melted, the at least a conductive post is bonded to the alloy portion.

11. The method of claim 1, further comprising forming a barrier layer between the first metal layer and the second metal layer such that the conductor further comprises the barrier layer formed between the first metal layer and the alloy portion.

12. The method of claim 1, further comprising forming an encapsulant between the carrier and the substrate for encapsulating the conductors.

13. The method of claim 12, wherein the encapsulant is formed after the second metal layer is melted.

14. The method of claim 12, wherein the encapsulant is formed on the carrier before the substrate is bonded to the carrier, and, after the substrate is bonded to the carrier, the conductive bumps are embedded in the encapsulant.

15. The method of claim 12, wherein the encapsulant is formed on the substrate to encapsulate the conductive bumps before the substrate is bonded to the carrier, and then the carrier is laminated to the encapsulant.

* * * * *